(12) United States Patent
Adsitt

(10) Patent No.: US 7,454,671 B2
(45) Date of Patent: Nov. 18, 2008

(54) MEMORY DEVICE TESTING SYSTEM AND METHOD HAVING REAL TIME REDUNDANCY REPAIR ANALYSIS

(75) Inventor: Matthew L. Adsitt, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 195 days.

(21) Appl. No.: 11/398,780

(22) Filed: Apr. 5, 2006

(65) Prior Publication Data
US 2007/0255982 A1 Nov. 1, 2007

(51) Int. Cl.
*G11C 29/00* (2006.01)
(52) U.S. Cl. ...................................... 714/719
(58) Field of Classification Search ................. 714/719
See application file for complete search history.

(56) References Cited
U.S. PATENT DOCUMENTS 6,026,505 A * 2/2000 Hedberg et al. ............. 714/711
6,397,349 B2 * 5/2002 Higgins et al. ................. 714/7
7,228,468 B2 * 6/2007 Wu et al. ..................... 714/710
2002/0019957 A1 * 2/2002 Higgins et al. ................. 714/7

* cited by examiner

*Primary Examiner*—James C Kerveros
(74) *Attorney, Agent, or Firm*—Dorsey & Whitney LLP (57) ABSTRACT

A memory device test system includes a signal generator providing memory command, address and write data signal to write data in a memory device and then read the data from the memory device. Each item of read data is compared to the corresponding item of write data, and fail data is produced indicative of the results of the comparison. The fail data is applied to a real time repair analyzer, which also receives an address of the read data being read to generate each item of fail data. The addresses are captured responsive to respective fail data signals to provide a record of the block, column and bit of each word of data read from a defective memory cell. The addresses are accumulated while the data are read from the memory device during testing so that a repair solution is available virtually as soon as the test has been completed.

46 Claims, 3 Drawing Sheets

MEMORY DEVICE TESTING SYSTEM AND METHOD HAVING REAL TIME REDUNDANCY REPAIR ANALYSIS

TECHNICAL FIELD

The present invention relates generally to the testing of semiconductor memories, and more specifically to a method and circuit for capturing and analyzing failure data in real time to provide a repair solution upon completion of failure data capture.

BACKGROUND OF THE INVENTION

During the manufacture of semiconductor memories, such as a synchronous dynamic random access memories ("SDRAMs"), it is necessary to test each memory to ensure it is operating properly. Electronic and computer systems containing semiconductor memories also normally test the memories when power is initially applied to the system. A typical SDRAM includes a number of arrays, each array including a number of memory cells arranged in rows and columns. During testing of the SDRAM, each memory cell must be tested to ensure it is operating properly. In a typical prior art test method, data having a first binary value (e.g., a "1") is written to and read from all memory cells in the arrays, and thereafter data having a different binary value (e.g., a "0") is typically written to and read from the memory cells. A memory cell is determined to be defective when the data written to the memory cell does not equal that read from the memory cell. As understood by one skilled in the art, other test data patterns may be utilized in testing the memory cells, such as an alternating bit pattern "101010 . . . 0" written to the memory cells in each row of the arrays.

In a typical test configuration, an automated memory tester is coupled to address, data, and control buses of the SDRAM, and applies signals to these buses to perform the desired tests. As the storage capacity of SDRAM and other memory devices increase, the number of memory cells and hence the number of data transfer operations the tester must perform correspondingly increases. For example, in a memory array having n rows and m columns of memory cells, the tester performs n*m cell accesses in writing the first binary values to all the memory cells in the array, and thereafter performs n*m cell accesses in reading the same data. The tester must once again perform n*m accesses in writing data having a second binary value to each memory cell, and the same number of accesses in reading this data. The tester thus performs a total of four times n*m cell accesses, each of which requires a bus cycle to perform.

As the tester reads data that has been written to each address of the memory device being tested, the tester compares each bit of the read data to the corresponding bit of the data that was written to that address. Any discrepancy in each comparison is recorded as a bit error for that cell, and the collection of bit errors is referred to as error data. The bit errors are generally stored in a high-speed memory, known as an Error Catch RAM ("ECR"), in real time at the rate the bit errors are generated. However, there are at least two problems with this approach. First, the storage capacity of the ECR must be commensurate with the storage capacity of the memory device being tested. Yet high capacity memory devices capable of operating at a sufficiently high speed are very expensive. One approach is to use an expensive high-speed static random access memory ("SRAM") device, which is capable of capturing the fail data from the memory device at the required operating speed. The other approach is to use interleaved banks of DRAM to capture the fail data. Interleaving pages of DRAM can be less expensive than using a high-speed SDRAM device, but poses additional complications in reconstructing the fail data. The difficulty in using either of these approaches is exacerbated by memory devices having significantly greater storage capacities, such as state-of-the-art NAND Flash memory devices. As a result, conventional testers must separately test different portions of such high-capacity memory devices, which requires a significant amount of time to complete a test.

The second problem with conventional ECR techniques is the length of time required to complete a test and use the test results to calculate a repair solution for the memory device being tested. Specifically, once the fail data have been captured by the ECR, the ECR must be scanned to read the fail data. A computer or other device used in the test system must then process the fail data to determine how the memory device being tested should be repaired by substituting redundant rows, columns or blocks of memory cells for rows, columns and blocks, respectively, of memory cells found to be defective. It can require a considerable period of time for the test system to read the ECR and then process the fail data, thereby slowing the throughput of the testing system.

There is therefore a need for a testing system and method that can capture and process fail data in read time as data bits are being read from a memory device being tested so that a repair solution for the memory device will be available almost as soon as the fail data capture has been completed.

SUMMARY OF THE INVENTION

A memory device testing system includes a signal generator that generates memory device command, address and write data signals. The signal generator initially outputs sets of memory write command signals, address signals and write data signals, which may be coupled to a memory device being tested. After a plurality of sets of write data have been stored in the memory device, the signal generator outputs sets of memory read command signals and address signals to cause the memory device to provide read data signals to the testing system. The testing system also includes a comparator that receives each set of read data signals and compare them to a corresponding set of the write data signals. The comparator outputs a fail data signal if each of the received set of read data signals does not match the corresponding set of write data signals. A real time repair analyzer is coupled to receive the sets of address signals from the signal generator and the fail data signal from the comparator. The repair analyzer is operable responsive to each fail data signal to capture a corresponding set of address signals. The repair analyzer is then operable to determine a repair solution from the captured sets of address signals while the address signals are being captured.

DETAILED DESCRIPTION OF THE INVENTION

Figure 1:
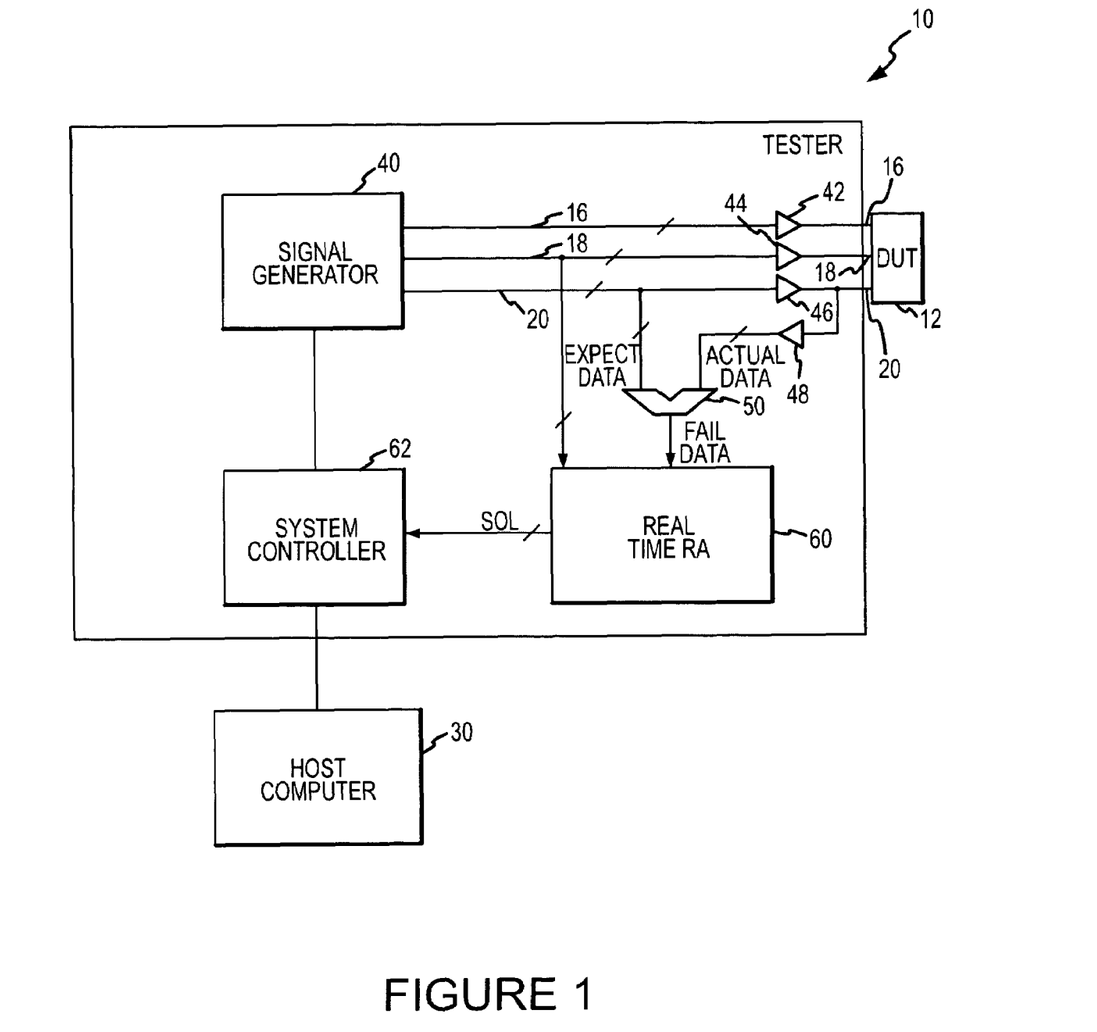
FIG. 1 is a block diagram illustrating a test system according to one example of the invention.

A test system 10 according to one example of the present invention is illustrated in FIG. 1. The test system 10 is connected to a device under test ("DUT"), which, in this example, is a memory device 12. The test system 10 is connected to the memory device 12 through a control bus 16, an address bus 18 and a data bus 20. The memory device 12 may be any conventional or hereinafter developed memory device, including a dynamic random access memory ("DRAM") device, a static random access memory ("SRAM") device, read only memory ("ROM") device, a flash memory device or some other type of memory device. In the example shown in FIG. 1, the memory device 12 is assumed to be a NAND Flash memory device. Also, the memory device 12 may be connected to the tester 10 through other than the control bus 16, address bus 18 and data bus 20. For example, a combined command/address bus may be used instead of a separate control bus 16 and address bus 18, or, in even the memory device 12 is a packetized memory device, a single communication path, which may be optical, may be used to couple signals to and from the memory device 12. Other variations will be apparent to one skill in the art or may be developed in the future. The tester 10 may also be connected to a host computer 30 programmed to receive test results and output a repair solution for the memory device 12. As is well-known in the art, memory devices are typically repaired by programming memory devices to substitute redundant memory cells for memory cells found to be defective.

The tester 10 also includes a signal generator 40 that provides a pattern of control, address and write data signals to the memory device 12 through respective drivers 42, 44, 46 and the command bus 16, address bus 18 and data bus 20, respectively. The number of bits in the control, address and write data signals will generally correspond to the width of the command bus 16, address bus 18 and data bus 20, respectively. The pattern of signals are such that predetermined write data are stored in the memory device 12. The write data may be, for example, data bits having a single value, i.e., all "0" or all "1," a predetermined data pattern, such as alternating "0" and "1" or some other pattern.

After a desired amount of data have been written to the memory device 12, the signal generator 40 applies appropriate command and address signals to the memory device 12 to read data from the memory device 12. If the memory device is operating properly, the pattern of read data will be identical to the pattern of write data. The read data signals from the memory device 12 are coupled through a driver 48 to one input of an exclusive OR-gate 50. Although only a single exclusive OR-gate 50 is shown in FIG. 1, it will be understood that an exclusive OR-gate is provided for each bit of data coupled from the memory device 12. As data bits are coupled to the exclusive OR-gate 50 from the addressed locations in the memory device 12, the write data bits written to the addressed location are output from the signal generator 40 and applied to the other input of the exclusive OR-gate 50. The exclusive OR-gate 50 compares the read data bits to the corresponding write data bits and outputs respective fail data bits having predetermined logic levels, such as a logic "1," in the event respective read data bits do not match the corresponding write data bits.

In prior art memory testers, the fail data bits would be written to a large and expensive error catch ram. In accordance with one example of the invention, the fail data bits from the exclusive OR-gate 50 are applied to a real time repair analyzer 60. As explained in greater detail below, the real time repair analyzer 60 captures the fail data bits as they are received from the exclusive OR-gate 50. The real time repair analyzer 60 also receives the block address ("Z Add") and column address ("Y Add") from the signal generator 40 and uses the addresses and captured fail data bits to calculate a repair solution for the memory device 12 in real time as the test is being conducted. At the conclusion of the test, repair solution data ("SOL") is provided to the host computer 30 via a system controller 62 with virtually no delay. As a result, the memory device 12 can be quickly repaired, thereby maximizing the throughput of the testing system 10.

Figure 2:
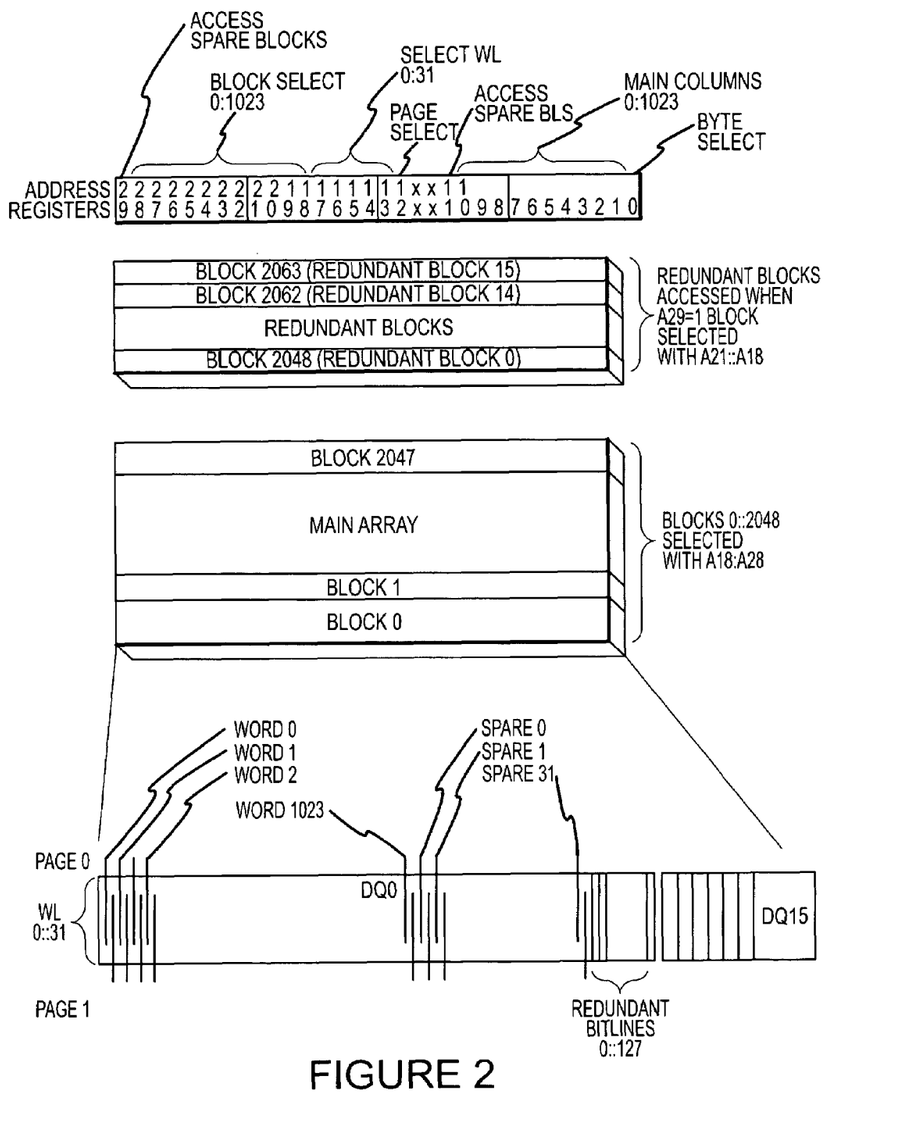
FIG. 2 is memory map showing an example of an address map for a memory device being tested using the test system of FIG. 1.

One example of a real time repair analyzer 60 will be explained with reference to FIG. 3. In the example shown in FIG. 3, it is assumed the memory device being tested outputs a 16-bit word from each address. A memory map for the memory device, which is assumed to be a NAND flash memory device, is shown in FIG. 2. The memory device is divided into 2048 blocks of memory cells arranged in rows and columns, and includes an additional 12 blocks of redundant memory cells that are used to repair memory cells found to be defective. Each block includes 32 rows of memory cells, and each row is divided into two pages. Each page has 1024 16-bit words. Therefore, there are 16,384 (1024*16) columns in each row. Each row also includes 16 columns of redundant memory cells which can also be used to repair memory cells found to be defective.

The addressing scheme for the real time repair analyzer 60 is shown at the top of FIG. 2. As shown therein, the Y28-Y18 bits selects one of 1024 blocks of memory cells. Looking at the row selection addresses, the Y17-Y13 bits select one of 32 rows in an addressed block, and the Y12 bit selects a page in the addressed row. Finally, the Y10-Y1 bits select one of 1024 16-bit words stored in respective sets of 16 columns in the addressed row, and the Y0 bit selects either an odd byte or an even byte of a selected word. Thus, the Y1 bit selects either an even word or an odd word.

The real time repair analyzer 60 operates with a number of repair restrictions that are either somewhat arbitrary or imposed by the design of the memory device itself. In this case, only one bit of any word may be repaired. Also, if block 0 is found to be defective, it must be repaired by substituting a redundant block. Finally, it is not possible to repair a single page of a row, nor is it possible to repair a single word. Instead, both pages of a row are repaired, and words having even and odd addresses are repaired together. As a result, the page address ("Y12") and the word address ("Y1") are compressed out. Finally, real time repair analyzer 60 operates under the assumption that there are natural pause points in the flow of read data from the memory device being tested. In other words, the data stored in all of the storage locations in the memory device is not read in one continuous burst. This assumption is true for virtually all memory devices. For example, in a dynamic random access memory device, data can be read from a single row in one continuous burst, but the read data flow must pause before the next row can be read since the digit lines in the device must first be equilibrated and sensed. Similarly, in a NAND flash memory device, a delay occurs between reading pages of an addressed row. A typical delay is 28 µs. Although the real time repair analyzer 60 operates with the repair restrictions described above for the example shown in FIGS. 1-3, it should be understood that other examples of the real time repair analyzer 60 can operate without such repair restrictions or with different repair restrictions.

As mentioned above, the memory device being tested is assumed to output a 16-bit word from each address. Therefore, the fail data output from the OR-gate 50 is also in the form of a 16-bit word. With reference to FIG. 3, the 16-bit fail data word is coupled through a 16-bit bus 64 to demultiplexing logic 66. The demultiplexing logic 66 first determines if there is more than one erroneous bit in the fail data word. If so, the demultiplexing logic 66 outputs a MultiDQ flag signal, which causes a bad block flag ("BBFlag") signal to be generated to indicate that the entire block must be repaired since, as mentioned above, one of the repair restrictions is that only one bit of any word may be repaired.

The BBFlag signal increments a BadBlock Counter 70, which keeps track of the number of bad blocks of memory and outputs a Fail Device signal when the number of bad blocks reaches a predetermined value. As mentioned above, in this example, the memory device 12 includes 12 redundant blocks of memory, so the BadBlock Counter 70 will output a Fail Device signal when the Counter increments to 13 bad blocks. The BBFlag signal from the demultiplexing logic 66 is also applied to a Bad Block memory 74, which also receives the block address ("Z Add") from the signal generator 40 (FIG. 1). The BBFlag signal causes the Bad Block memory 74 to record the block address ("Z Add") that is being applied to the real time repair analyzer 60 when the BBFlag signal is generated so a record identifying the bad blocks can be subsequently used to provide a repair solution for the memory 12, as will be explained in greater detail below.

Assuming that one or fewer of the 16 fail bits are a "1," the demultiplexing logic 66 outputs 4 bits identifying any of the 16 bits of the data word currently being read that were found to be in error. These 4 bits are stored in a Page BitFails memory 80 along with the current block and column address. The memory 80 is therefore able to identify the defective memory location, i.e., block and columns of memory cells storing the read data word, as well as the memory cell storing the defective bit of the word. The memory 80 need not record the row address of the defective memory location since the memory device 12 is repaired on either a block-by-block or column-by-column basis. The Page BitFails memory 80 accumulates the information identifying the defective memory cells for an entire page. The memory 80 can store this information for 16 columns. As a result, only 16 columns in the memory device 12 can be repaired. If memory cells in more than 16 columns of the memory device 12 are defective, the need to repair some of the columns must be eliminated by using a redundant block for a block containing some memory cells. Therefore, after addresses for more than 16 defective columns have been stored in the Page BitFails memory 80, any subsequent failure causes the memory 80 to output an OverFlow signal, which causes the BBFlag signal to be generated. As explained above, setting the BBFlag signal has the effect of replacing the block containing the defective memory cell with a redundant block, or, if there are no remaining blocks, causing the BadBlock Counter 70 to output the Fail Device signal. The OverFlow signal can also cause the signal generator 40 to skip reading from the rest of the page so that the analysis performed by the test system 10 halts until the next page is read.

After each page of memory cells of the memory device 12 have been read, the Page BitFails memory 80 is storing for each defective memory cell in that page, the 11-bit block address ("Z Add") plus an additional Z bit to identify a defective redundant block, the 9 most significant bits of the 10-bit column address ("Y Add") and the 4 bits ("DQ") identifying the column containing the defective one of the 16 memory cells storing the read data word. Insofar as only the 9 most significant bits of the 10-bit column address are stored, a word having an even address is repaired along with a repaired word having an odd address, and a word having an odd address is repaired along with a repaired word having an even address. In other words, odd and even words are repaired together.

As explained above, memory devices typically operate with natural pause points in the flow of read data. Using the assumption that, in the example shown in FIGS. 1-3, the memory device 12 is a NAND flash memory device, a delay occurs between reading pages of an addressed row. However, other memory devices have other pause points that will alter the design of the real time repair analyzer 60 in a manner that will be apparent to one skilled in the art. If a memory device 12 being tested does not have a natural pause point, the analyzer 60 may be interfaced with the signal generator 40 to provide a pause point by temporarily halting the output of read commands and address from the signal generator 40. In the example shown in FIG. 3, the real time repair analyzer 60 uses the pause occurring after each page is read to transfer the addresses stored in the Page BitFails memory 80 to a Cols Per Block memory 84. At the same time, the Page BitFails memory 80 is cleared so that addresses from the next page to be read can be stored in the memory 80.

The Cols Per Block memory 84 stores the same information that is stored in the Page BitFails memory 80, but it accumulates all of the addresses stored in the memory 80 as all of the columns in a block are read. The memory 84 also stores a 5-bit field ("BitCnt:5") identifying the number of times each column identified by an address stored in the memory 84 has been found to be defective. This bit count field is updated during the transfer of the addresses from the memory 80 by comparing each column address stored in the memory 80 to the column addresses stored in the memory 84. In the event of a match, the BitCnt field for that address is incremented. The Cols Per Block memory 84 also compare the DQ field of each address stored in the Page BitFails memory 80 with the data stored in the DQ fields of each address stored in the Cols Per Block memory 84 to detect a failure of multiple bits of a single word. As previously explained, in such case, the block containing the defective cells must be repaired by substituting a redundant block. Therefore, if Cols Per Block memory 84 detects a failure of multiple bits of a single word, it outputs a MultiDQ OverFlow signal, which causes the BBFlag signal to be generated. The Cols Per Block memory 84 also outputs the MultiDQ OverFlow signal in the event addresses for more than 16 columns are transferred to the memory 84 since only 16 columns of the memory device can be repaired. In the same manner, if an entire redundant block is found to be defective, the MultiDQ OverFlow signal resulting from more than 16 columns being defective will cause the block address for the defective redundant block to be stored in the BadBlock memory 74 so the defective block will not be used as part of a repair solution.

After all of the pages of a block have been read, the addresses and bit count stored in the Cols Per Block memory 84 are transferred to a Local Cols memory 88. The Local Cols memory 88 stores the same information that is stored in the Cols Per Block memory 84, except that the BitCnt field is enlarged to 8 bits so that it can record up to 256 failures of each column having an address stored in the memory 88. After all of the blocks of memory cells have been read, the Local Cols memory 88 will have accumulated the addresses of all columns containing a defective memory cell in all of the blocks of the memory device 12. Like the 5-bit BitCnt field stored in the Cols Per Block memory 84, the 8-bit BitCnt field stored in the Local Cols memory 88 is updated during the transfer of the addresses from the memory 84 by comparing each column address stored in the memory 84 to the column addresses stored in the memory 88. In the event of a match, the BitCnt field for that address is incremented.

Figure 3:
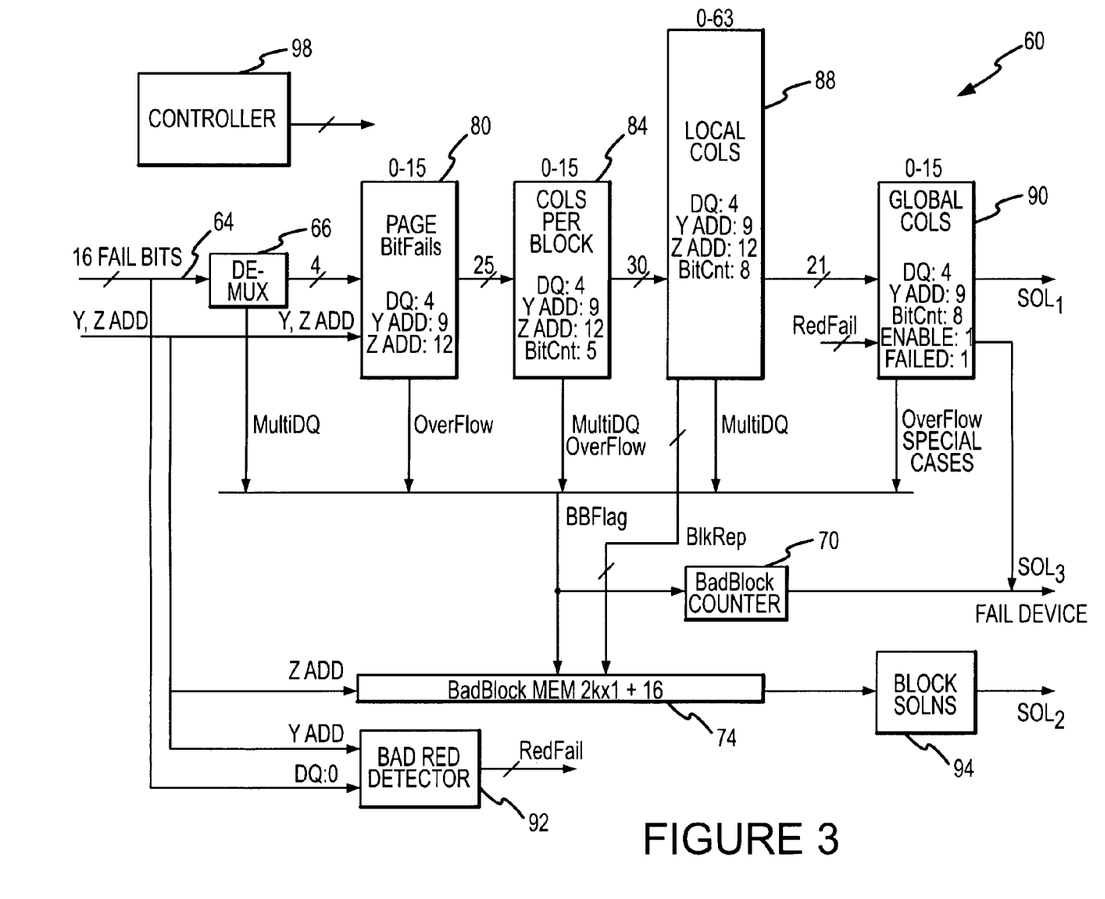
FIG. 3 is a block diagram showing one example of a real time repair analyzer used in the test system of FIG. 1.

The Local Cols memory 88 can store the addresses for only 16 columns since only 16 columns of the memory device 12 can be repaired in the example shown in FIGS. 1-3. Before the Cols Per Block memory 84 can transfer additional column addresses to the Local Cols memory 88, the Local Cols memory 88 must free up space for the storage of such addresses. The Local Cols memory 88 performs this function by using a priority scheme to determine which column addresses should be deleted. One example of a priority scheme is based on the assumption that the addresses for defective columns spanning the least number of blocks should be deleted since these defective columns can be repaired by substituting relatively few redundant blocks of memory cells. For example, a column that is defective in only a single block can be repaired by substituting a single redundant block for the block containing a defective memory cell. In contrast, repair of a column that is defective in four blocks would require substituting four blocks of memory cells for the four blocks containing the defective column. If a transfer from the Col. Per Block memory 84 would result in the addresses for more than 16 columns being stored in the Local Cols memory 88, the memory 88 uses the priority scheme to delete addresses for columns spanning relatively few blocks. At the same time, the Local Cols memory 88 transfers the address ("BlkRep") for the block containing the columns for which the addresses were deleted to the Bad Block memory 74 for storage therein since it is necessary to repair such blocks.

The Local Cols memory 88 also checks for the failure of multiple bits of a single word, and, if such multiple bit failure is detected, the Local Cols memory 88 outputs a MultiDQ signal that also causes the BBFlag signal to be generated. However, the Local Cols memory 88 also detects the presence of addresses for respective columns that span a specific number of blocks, such as 4 blocks. The Local Cols memory 88 detects this condition by determining if each column address is paired with more than 4 block addresses. In the example illustrated in FIGS. 1-3, if this condition is detected, it is considered necessary to repair the defective column spanning more than 4 blocks. However, in other examples of the real time repair analyzer 60, this condition may not make it necessary to repair the defective column. If the Local Cols memory 88 detects the presence of addresses for respective columns that span more than 4 blocks, it transfers the information for that column to a Global Cols memory 90. This transfer frees up space in the Local Cols memory 88 to store information about additional defective columns. As explained in greater detail below, the Global Cols memory 90 stores the column repair solution, i.e., the addresses of all columns that will be repaired. These addresses $SOL_1$ are part of the repair solution data SOL provided to the host computer 30 (FIG. 1) as previously explained.

The Global Cols memory 90 also receives RedFail data from a Bad Red Detector 92, which receives the column address ("Y Add") and a DQ:0 bit from the OR-gate 50 (FIG. 1). The signal generator outputs addresses to test the redundant columns of memory cells as well as the other columns of memory cells. However, only a single column is accessed for each redundant column address in contrast to the 16 columns accessed for each non-redundant column addresses. Therefore, the OR-gate 50 will output only one bit DQ:0, which will be high if the redundant column is defective. The Bad Red Detector 92 detects the high DQ:0 bit and then outputs the address RedFail of the defective column to the Global Cols memory 90 so that the Global Cols memory 90 will not use the defective column in its repair solution $SOL_1$. The Bad Red Detector 92 is able to determine that the column address Y Add is for a redundant column by comparing the column address to the maximum number of non-redundant columns, which in the example illustrated, is 1023. If the column address is higher than 1023, then the column address is passed to the Global Cols memory 90 if the DQ:0 bit is high. As a result, the addresses $SOL_1$ provided by the Global Cols memory 90 will be for no more than the 16 redundant columns of memory cells less any columns of memory cells that are found to be defective.

After all of the data have been read from the memory device 12, the addresses of all columns remaining in the Local Cols memory 88 are transferred to the Global Cols memory 90, and the Local Cols memory 88 is cleared. The contents of the Bad Block memory 74 are also transferred to a Block Solution memory 94, which outputs the addresses $SOL_2$ of the blocks that will be repaired as part of the repair solution data SOL provided to the host computer 30. The addresses $SOL_2$ provided by the Block Solution memory 94 will be for no more than the 16 redundant blocks of memory cells less any blocks of memory cells that are found to be defective. Finally, in the event the number of blocks that must be repaired exceeds the number of available redundant blocks, the BadBlock counter 70 outputs a Fail Data signal $SOL_3$, which is also part of the repair solution data SOL provided to the host computer 30. Similarly, in the event the number of columns that must be repaired exceeds the number of available redundant columns, the Global Cols memory 90 outputs the Fail Data signal $SOL_3$ to the host computer 30.

The operation of the above-described components of the real time repair analyzer 60 is controlled by signals from a controller 98. The controller 98 may be a properly programmed processor or a state machine. The programming of a processor or design of a state machine to cause the components of the analyzer 60 as described above is well within the ability of one skilled in the art.

The host computer 30 uses the repair solution data $SOL_{1-3}$ to either repair or reject the memory device 12 being tested, as previously explained with reference to FIG. 1. Significantly, the repair solution $SOL_{1-3}$ is available in essentially real time virtually as soon as all of the data stored in the memory device 12 have been read during a test. As a result, it is not necessary to delay repair of the memory device 12, after the test has been completed, while the fail data from the OR-gate 50 are processed to determine a repair solution.

From the foregoing it will be appreciated that, although specific embodiments of the invention have been described herein for purposes of illustration, it will be understood by one skilled in the art that various modifications may be made without deviating from the spirit and scope of the invention. For example, the nature of the fail data captured by the real time repair analyzer for other types of flash memory devices and other memory devices other than flash memory devices will vary depending upon such factors as the addressing of such memory devices and the manner in which such devices are to be repaired. Also, the number of fail data bits that must be applied to the real time repair analyzer can also be varied depending upon various factors. For example, if repairs are to be made on a word-by-word basis rather than on a bit-by-bit basis, then a single bit of fail data can be applied to the analyzer if any bit of the word is in error, and it is not necessary for the analyzer to capture the fail data bit corresponding to the erroneous bit. Instead, the repair analyzer need capture only the address of the word containing the erroneous bit. Accordingly, the invention is not limited except as by the appended claims.

What is claimed is:

1. A test system for testing a memory device, comprising:
   a signal generator to initially generate and output from the test system sets of memory write command signals and sets of address signals and to output from the test system respective sets of write data signals along with each of the sets of the memory write command signals, the signal generator further subsequently generating and outputting from the test system sets of memory read command signals and sets of address signals, the command and address signals being generated in a manner that requires all of the memory cells being tested to be accessed during a test only once for writing data and only once for reading data;
   a comparator coupled to the signal generator, the comparator being to receive each set of read data signals received by the test system responsive to each set of the memory read command signals and each set of the address signals output from the test system, the comparator comparing each set of received read data signals to a corresponding set of the write data signals, the comparator outputting a fail data signal responsive to at least one signal in the received set of read data signals not matching a corresponding signal in the set of write data signals; and
   a repair analyzer coupled to the signal generator and the comparator, the repair analyzer receiving the sets of address signals from the signal generator and the fail data signal from the comparator, the repair analyzer being responsive to each fail data signal to capture a corresponding set of address signals, analyze the captured address signals to identify addresses corresponding to a failing group of memory cells based on the number of subgroups of memory cells in group that have failed and determine from the identified addresses while the addresses signals are being captured a repair solution.

2. The test system of claim 1 wherein the comparator outputs a respective fail data signal responsive to each read data signal in the received set of read data signals that does not match the corresponding write data signal in the set of write data signals.

3. The test system of claim 2 wherein the repair analyzer outputs capture each fail data signal from the comparator and to determine the repair solution from each captured fail data signals and each captured set of address signals.

4. The test system of claim 2 wherein the repair analyzer comprises a demultiplexer that generates a multi-bit failure signal responsive to more than one fail data signal being generated from the received set of read data signals, and wherein each of the sets of address signals received from the signal generator further comprises a set of block address signals, and wherein the repair analyzer further comprises a memory receiving the sets of block address signals, the memory being responsive to the multi-bit failure signal to store the sets of block address signals received from the signal generator, the memory storing the sets of block address signals for use as part of the repair solution.

5. The test system of claim 4 further comprising a bad block counter coupled to the memory and being responsive to the multi-bit failure signal to provide a count indicative of the number of sets of block address signals stored in the memory, the bad block counter generating a fail device signal responsive to the multi-bit failure signal after a predetermined number of sets of block address signals have been stored in the memory, the fail device signal providing an indication that the memory device cannot be repaired.

6. The test system of claim 4 wherein, if not more than one fail data signal is generated from the received set of read data signals, the demultiplexer generating a binary number indicating the read data signal in the received set of read data signals that resulted in the fail data signal.

7. The test system of claim 1 wherein the repair analyzer comprises:
   a first memory coupled to receive the sets of address signals from the signal generator and being responsive to each fail data signal to capture a corresponding set of address signals as the signal generator repetitively generates and outputs from the test system sets of memory read command signals and sets of address signals for predetermined ranges of addresses as sets of read data signals are received by the test system; and
   a second memory coupled to the first memory to periodically receive and store the sets of address signals stored in the first memory after sets of read data signals have been received by the test system from each of a plurality of address ranges.

8. The test system of claim 7 wherein the sets of address signals that the first memory captures comprise sets of column address signals, and wherein the first memory generates an overflow signal responsive to the fail data signal occurring after more than a specific number of sets of column address signals have been stored in the first memory.

9. The test system of claim 8 wherein the sets of address signals received from the signal generator further comprises sets of block address signals, and wherein the repair analyzer further comprises a third memory receiving the sets of block address signals, the third memory being responsive to the overflow signal to store the sets of block address signals received from the signal generator for use as part of the repair solution.

10. The test system of claim 9 further comprising a bad block counter coupled to the third memory and being responsive to the overflow signal to provide a count indicative of the number of sets of block address signals stored in the third memory, the bad block counter generating a fail device signal responsive to the overflow signal after a predetermined number of sets of block address signals have been stored in the third memory, the fail device signal providing an indication that the memory device cannot be repaired.

11. The test system of claim 7 wherein the sets of address signals that the first memory captures and the sets of address signals that the second memory periodically receives and stores comprises sets of column address signals, and wherein the sets of address signals in each of the address ranges comprises sets of column address signals for respective pages, the second memory accumulating sets of column address signals received from the first memory for multiple pages of column addresses.

12. The test system of claim 11 wherein the second memory further determines and store the number of times that each set of column address signals is received from the first memory.

13. The test system of claim 11 wherein the second memory accumulates sets of column address signals in multiple pages of each of a plurality of blocks of addresses.

14. The test system of claim 13, further comprising a third memory coupled to the second memory, the third memory receiving the sets of column address signals stored in the second memory after sets of read data signals have been received by the test system responsive to each block of addresses, the third memory accumulating sets of column address signals received from the second memory for multiple blocks of column addresses.

15. The test system of claim 14 wherein the sets of address signals that the first memory captures and the sets of address signals that the second memory periodically receives and stores further comprises sets of block address signals, and wherein the third memory selectively clears accumulated sets of column address signals from the third memory, the third memory outputting the sets of block address signals associated with any accumulated sets of column address signals cleared from the third memory.

16. The test system of claim 15, wherein the repair analyzer further comprises a fourth memory receiving from the third memory and store the sets of block address signals associated with any accumulated sets of column address signals cleared from the third memory, the fourth memory storing sets of block address signals for use as part of the repair solution.

17. The test system of claim 14, further comprising a fourth memory coupled to receive and store the sets of column address signals stored in the third memory after the signal generator has generated sets of memory read command signals and sets of address signals for all of the addresses of the memory device, the sets of column address signals stored in the fourth memory being used as part of the repair solution.

18. The test system of claim 1, further comprising a host computer coupled to receive the repair solution from the repair analyzer.

19. The test system of claim 1 wherein the repair analyzer completes determining the repair solution from the captured sets of address signals in read time with all of the sets of address signals being captured.

20. A repair analyzer repetitively receiving sets of address signals, the repair analyzer further receiving a fail data signal indicative of each erroneous bit in a test data word corresponding to each of the received sets of address signals, the repair analyzer being responsive to receiving a fail data signal to capture the received set of address signals, analyze the captured address signals to identify addresses corresponding to a failing group of memory cells based on the number of subgroups of memory cells in group that have failed and to determine a repair solution from the identified addresses while the sets of address signals are being captured.

21. The repair analyzer of claim 20 wherein the repair analyzer captures a respective fail data signal indicative of each erroneous bit in each test data word and to determine the repair solution from each captured fail data signal and each corresponding set of captured address signals.

22. The repair analyzer of claim 20 wherein the repair analyzer comprises a demultiplexer that generates a multi-bit failure signal responsive to more than one fail data signal being received responsive to more than one erroneous bit in a test data word, and wherein each of the received sets of address signals further comprises a set of block address signals, and wherein the repair analyzer further comprises a memory receiving the sets of block address signals, the memory being responsive to the multi-bit failure signal to store the received set of block address signals, the memory storing the sets of block address signals for use as part of the repair solution.

23. The repair analyzer of claim 22 further comprising a bad block counter coupled to the memory and being responsive to the multi-bit failure signal to provide a count indicative of the number of sets of block address signals stored in the memory, the bad block counter generating a fail device signal responsive to the multi-bit failure signal after a predetermined number of sets of block address signals have been stored in the memory.

24. The repair analyzer of claim 22 wherein, if not more than one fail data signal is received responsive to not more than one erroneous bit in a test data word, the demultiplexer generates a binary number indicating the bit of the test data word that resulted in the fail data signal.

25. The repair analyzer of claim 20 wherein the repair analyzer comprises:
a first memory coupled to receive the sets of address signals and being responsive to receiving a fail data signal to capture the received set of address signals as sets of address signals are received by the repair analyzer for predetermined ranges of addresses; and
a second memory coupled to the first memory to periodically receive and store the sets of address signals stored in the first memory after sets of address signals are received by the repair analyzer for each of a plurality of address ranges.

26. The repair analyzer of claim 25 wherein the sets of address signals that the first memory captures comprise sets of column address signals, and wherein the first memory generates an overflow signal responsive to the fail data signal occurring after more than a specific number of sets of column address signals have been stored in the first memory.

27. The repair analyzer of claim 26 wherein the received sets of address signals comprises sets of block address signals, and wherein the repair analyzer further comprises a third memory receiving the sets of block address signals, the third memory being responsive to the overflow signal to store the received sets of block address signals repair analyzer for use as part of the repair solution.

28. The repair analyzer of claim 27 further comprising a bad block counter coupled to the third memory and being responsive to the overflow signal to provide a count indicative of the number of sets of block address signals stored in the third memory, the bad block counter generating a fail device signal responsive to the overflow signal after a predetermined number of sets of block address signals have been stored in the third memory.

29. The repair analyzer of claim 25 wherein the sets of address signals that the first memory captures and the sets of address signals that the second memory periodically receives and stores comprises sets of column address signals, and wherein the sets of address signals in each of the address ranges comprises sets of column address signals for respective pages, the second memory accumulating sets of column address signals received from the first memory for multiple pages of column addresses.

30. The repair analyzer of claim 25 wherein the second memory further determines and stores the number of times that each set of column address signals is received from the first memory.

31. The repair analyzer of claim 25 wherein the second memory accumulates sets of column address signals in multiple pages of each of a plurality of blocks of addresses.

32. The repair analyzer of claim 31, further comprising a third memory coupled to the second memory, the third memory receiving the sets of column address signals stored in the second memory after sets of read data signals have been received by the test system responsive to each block of addresses, the third memory accumulating sets of column address signals received from the second memory for multiple blocks of column addresses.

33. The repair analyzer of claim 32 wherein the sets of address signals that the first memory captures and the sets of address signals that the second memory periodically receives and stores further comprises sets of block address signals, and wherein the third memory selectively clears accumulated sets of column address signals from the third memory, the third memory outputting the sets of block address signals associated with any accumulated sets of column address signals cleared from the third memory.

34. The repair analyzer of claim 33, further comprising a fourth memory receiving from the third memory and storing the sets of block address signals associated with any accumulated sets of column address signals cleared from the third memory, the fourth memory storing sets of block address signals for use as part of the repair solution.

35. The repair analyzer of claim 32, further comprising a fourth memory coupled to receive and store the sets of column address signals stored in the third memory all of the sets of address signals have been received, the sets of column address signals stored in the fourth memory being used as part of the repair solution.

36. The repair analyzer of claim 20 wherein the repair analyzer completes determining the repair solution from the captured sets of address signals in real time with all of the sets of address signals being captured.

37. A method of testing a memory device, comprising:
transmitting to the memory device sets of memory write command signals;
transmitting to the memory device a set of address signals contemporaneously with each of the transmitted sets of write command signals, each of the address signals being transmitted with the write command signals only once for the test of the memory device;
transmitting to the memory device a set of write data signals contemporaneously with each of the transmitted sets of write command signals;
after a plurality of sets of write command signals have been transmitted to the memory device, transmitting to the memory device sets of memory read command signals;
transmitting to the memory device a set of address signals contemporaneously with each of the transmitted sets of read command signals, each of the address signals being transmitted with the read command signals only once for the test of the memory device;
receiving sets of read data signals responsive to respective sets of read command signals and respective sets of contemporaneously transmitted address signals;
comparing each set of received read data signal to a corresponding set of the write data signals;
providing a fail data signal responsive to the received set of read data signals not matching the corresponding set of write data signals;
in response to each fail data signal, capturing a corresponding set of address signals;
analyzing the captured address signals to identify addresses corresponding to a failing group of memory cells based on the number of subgroups of memory cells in group that have failed; and
determining a repair solution from the analysis while the addresses signals are being captured.

38. The method of claim 37 wherein the act of providing a fail data signal responsive to the received set of read data signals not matching the corresponding set of write data signals comprises providing a respective fail data signal responsive to each read data signal in the received set of read data signals not matching the corresponding write data signal in the set of write data signals.

39. The method of claim 38 further comprising capturing each fail data signal, and wherein the act of determining a repair solution from the captured sets of address signals further comprises determining the repair solution from each captured fail data signals and each captured set of address signals.

40. The method of claim 38 wherein the method further comprises generating a first signal responsive to more than one fail data signal being generated from the received set of read data signals, wherein the act of capturing a corresponding set of address signals in response to each fail data signal comprises capturing a corresponding set of block address signals, wherein the method further comprises storing the sets of captured block address signals responsive to the first signal, and wherein the act of determining a repair solution from the captured sets of address signals comprises using the stored sets of captured block address signals to determine the repair solution.

41. The method of claim 40 further comprising generating a fail device signal responsive to the first signal after a predetermined number of sets of block address signals have been stored, the fail device signal providing an indication that the memory device cannot be repaired.

42. The method of claim 37 wherein the act of capturing a corresponding set of address signals in response to each fail data signal comprises
in responsive to each fail data signal, capturing a corresponding set of address signals as sets of memory read command signals and sets of address signals for predetermined ranges of addresses are applied to the memory device; and
periodically storing the stored sets of address signals after sets of address signals for a plurality of the predetermined ranges of addresses are applied to the memory device.

43. The method of claim 42 wherein the captured sets of address signals comprise sets of column address signals, and wherein the method further comprises generating an overflow signal responsive to the fail data signal occurring after more than a specific number of sets of column address signals have been stored.

44. The method of claim 43 wherein the captured sets of address signals comprise sets of block address signals, wherein the method further comprises storing the captured sets of block address signals responsive to the overflow signal, and wherein the act of determining a repair solution from the captured sets of address signals comprises using the captured sets of block address signals as part of the repair solution.

45. The method of claim 37 further comprising:
determining the number of times that each set of address signals is captured; and
storing the determined number.

46. The method of claim 37 wherein the act of determining a repair solution from the captured sets of address signals while the addresses signals are being captured comprises completing the determination of a repair solution from the captured sets of address signals in real time with all of the sets of address signals being captured.

* * * * *